US008201110B1

(12) United States Patent
Gu et al.

(10) Patent No.: US 8,201,110 B1
(45) Date of Patent: Jun. 12, 2012

(54) OPTICAL PROXIMITY CORRECTION USING REGRESSION

(75) Inventors: Allan Gu, Alhambra, CA (US); Avideh Zakhor, Berkeley, CA (US); Peiran Gao, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 303 days.

(21) Appl. No.: 12/423,406

(22) Filed: Apr. 14, 2009

Related U.S. Application Data

(60) Provisional application No. 61/044,714, filed on Apr. 14, 2008.

(51) Int. Cl.
*G06F 17/50* (2006.01)
(52) U.S. Cl. ........................................................ 716/53
(58) Field of Classification Search ...................... 716/53
See application file for complete search history.

(56) References Cited

U.S. PATENT DOCUMENTS 7,360,199 B2 * 4/2008 Scaman ........................... 716/53
7,778,805 B2 * 8/2010 Huang et al. ...................... 703/2

OTHER PUBLICATIONS

Brueck, S.R.J. et al., "Spatial frequency analysis of optical lithography resolution enhancement techniques," Journal of Vacuum Science Technology B: Microelectronics and Nanometer Structures, May 1999, vol. 17, pp. 908-920, American Vacuum Society.
Boyd, S. et al., "Convex Optimization," 2004, Cambridge University Press, p. 307.
Cobb, N., "Fast Optical and Process Proximity Correction Algorithms for Integrated Circuit Manufacturing," PhD thesis, 1998, University of California.
Frye, R. et al., "Neural network proximity effect corrections for electron beam lithography," Conference Proceedings: 1990 IEEE International Conference on Systems, Man and Cybernetics, Nov. 4-7, 1990, pp. 704-706, IEEE.
Hecht, E., "Optics," 2001, Addison Wesley, 4th edition, p. 56.
Huang, W.C. et al., "Intelligent model-based OPC," Optical Microlithography XIX. Proceedings of the SPIE., Apr. 2006, vol. 6154, pp. 1065-1063, SPIE.
Jackson, J.E., "A User's Guide to Principal Components," 1991, Wiley-Interscience Publication, p. 271.
Jedrasik, P., "Neural networks application for OPC (optical proximity correction) in mask making," Microelectronic Engineering, Jan. 1996, pp. 161-164, vol. 30, No. 1-4, Elsevier B.V.
Sung, H.G., "Gaussian Mixture Regression and Classification," PhD thesis, 2004, Rice University.
Wetherill, G.B., et al., "Regression Analysis with Applications," 1986, Chapman and Hall, p. 94.

* cited by examiner

*Primary Examiner* — Thien F Tran
(74) *Attorney, Agent, or Firm* — Withrow & Terranova, P.L.L.C.

(57) ABSTRACT

Optical proximity correction (OPC) is a technique used to compensate for optical distortions, process effects, or both, by modifying a pattern that is used during lithography. A reference OPC model is used to create an OPC design layout pattern based on pre-distorting a desired design layout pattern associated with an integrated circuit (IC). The OPC design layout pattern is used when the IC is produced, such that the fabricated IC ideally matches the desired design layout pattern. The present invention relates to using a regression OPC model to create estimated fragment movements of the desired design layout pattern. The estimated fragment movements are then provided as initial fragment movements to the reference OPC model, which then creates the OPC design layout pattern. The initial fragment movements provided by the regression OPC model may reduce the number of iterations needed by the reference OPC model, thereby reducing computation time.

15 Claims, 9 Drawing Sheets

OPTICAL PROXIMITY CORRECTION USING REGRESSION

This application claims the benefit of provisional patent application Ser. No. 61/044,714, filed Apr. 14, 2008, the disclosure of which is hereby incorporated herein by reference in its entirety.

This invention was made with Government support under DARPA Grant No. W911NF-04-1-0304. The Government has certain rights to this invention.

FIELD OF THE INVENTION

Embodiments of the present invention relate to optical proximity correction (OPC) of lithographic masks, reticles, or both, which are used in the fabrication of integrated circuits (ICs).

BACKGROUND OF THE INVENTION

Optical lithography is a process using light, such as ultraviolet (UV) light, to transfer a pattern associated with an integrated circuit (IC) design from a lithographic mask, reticle, or both, to a layer of photoresist material that has been deposited on a surface of a semiconductor wafer. Either the exposed portion of the photoresist material or the unexposed photoresist material is removed, thereby enabling further fabrication of the IC design. Typically, multiple layers are involved in the fabrication of an IC. As the semiconductor industry continues to push toward smaller device geometries, the wavelength of light used in the lithographic process may be on the order of the linewidths used in the IC design. Therefore, optical distortions of the transferred pattern may occur. Further, manufacturing process effects may cause additional distortions in the fabrication of the IC.

Optical proximity correction (OPC) is a technique used to compensate for optical distortions, process effects, or both, by modifying or correcting the pattern that is used during lithography. There are at least two types of OPC, which may include rule based OPC and model based OPC. In rule based OPC, experiments are used to determine the corrections that are needed to compensate for the non-ideal effects of the lithography system and the manufacturing process. Unlike rule based OPC, model based OPC uses simulations, typically in an iterative manner to determine the OPC needed for a specific IC design. A reference OPC model, which may include an optical model, a resist model, other process effects models, or any combination thereof, is created for a specific process technology and used in a fabrication simulation to simulate the distortions that a desired design layout pattern undergoes during the lithography process, the manufacturing process, or both. Additionally, the reference OPC model is used to create an OPC design layout pattern based on pre-distorting the desired design layout pattern, such that when the IC is produced, the OPC design layout pattern provides a fabricated IC that ideally matches the desired design layout pattern.

The desired design layout pattern is made up of multiple polygons. The OPC design layout pattern is created by fragmenting the polygons of the desired design layout pattern and moving the fragments to create necessary pre-distortions of the desired design layout pattern. The reference OPC model typically uses many iterations to create an OPC design layout pattern. The reference OPC model begins by applying initial fragment movements to the desired design layout pattern to create an initial OPC design layout pattern. The initial OPC design layout pattern is then fed into the fabrication simulation. The results of the fabrication simulation are compared to the desired design layout pattern. If necessary, additional fragment movements are applied to the initial OPC design layout pattern to create another OPC design layout pattern, which is then fed into the fabrication simulation. This process is repeated until the results of the fabrication simulation nearly match the desired design layout pattern. The number of iterations to create an OPC design layout pattern is based on how close the initial fragment movements are to the needed fragment movements in the OPC design layout pattern and how quickly the iterative fragment movements converge on the needed fragment movements.

The fabrication simulation may be very complex for large IC designs and thousands of fragment movements may be necessary for each iteration. Additionally, large IC designs may require many iterations. Therefore, the computation time for a large IC design may take days. Since computation time for an IC design is about proportional to the number of iterations needed to create a final OPC design layout pattern, and since the number of iterations is based on how close the initial fragment movements are to the needed fragment movements in the OPC design layout pattern, the computation time for an IC design may be significantly reduced if the initial fragment movements are close to the needed fragment movements in the OPC design layout pattern. Thus, there is a necessity to determine initial fragment movements that are close to the needed fragment movements.

SUMMARY OF THE EMBODIMENTS

Optical proximity correction (OPC) is a technique used to compensate for optical distortions, process effects, or both, by modifying or correcting a pattern that is used during lithography. A reference OPC model is used to create an OPC design layout pattern based on pre-distorting a desired design layout pattern associated with an integrated circuit (IC). The OPC design layout pattern is used when the IC is produced, such that the fabricated IC ideally matches the desired design layout pattern. The present invention relates to using a regression OPC model to create estimated fragment movements of the desired design layout pattern. The estimated fragment movements are then provided as initial fragment movements to the reference OPC model, which then creates the OPC design layout pattern. The initial fragment movements provided by the regression OPC model may reduce the number of iterations needed by the reference OPC model to create the OPC design layout pattern, thereby reducing computation time.

The regression OPC model approximates OPC using regression; therefore, the regression OPC model is typically simpler than the reference OPC model. In one embodiment of the present invention, the regression OPC model is trained using regression techniques associated with a training design layout pattern. During training, the reference OPC model is used to create training fragment movements of the training design layout pattern. The training fragment movements are associated with OPC of the training design layout pattern. The regression OPC model is trained by using regression to relate the training design layout pattern to the training fragment movements. The regression may be linear regression, which may use Gaussian convolution.

In another embodiment of the present invention, the regression OPC model may be selected from multiple trained regression OPC models. Each of the multiple trained regression OPC models may be evaluated, such that the selected regression OPC model provides estimated evaluation fragment movements that most closely match evaluation fragment movements. During the evaluation, the reference OPC model is used to create the evaluation fragment movements of an evaluation design layout pattern. The evaluation fragment movements are associated with OPC of the evaluation design layout pattern. Each of the multiple trained regression OPC models is used to create a set of estimated evaluation fragment movements of the evaluation design layout pattern. Each set of estimated evaluation fragment movements is compared to the evaluation fragment movements. The regression OPC model that provides the set of estimated evaluation fragment movements that most closely matches the evaluation fragment movements is selected as the regression OPC model. The comparison of the estimated evaluation fragment movements to the evaluation fragment movements may be based on a root mean square prediction error (RMSPE).

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Optical proximity correction (OPC) is a technique used to compensate for optical distortions, process effects, or both, by modifying or correcting a pattern that is used during lithography. A reference OPC model is used to create an OPC design layout pattern based on pre-distorting a desired design layout pattern associated with an integrated circuit (IC). The OPC design layout pattern is used when the IC is produced, such that the fabricated IC ideally matches the desired design layout pattern. The present invention relates to using a regression OPC model to create estimated fragment movements of the desired design layout pattern. The estimated fragment movements are then provided as initial fragment movements to the reference OPC model, which then creates the OPC design layout pattern. The initial fragment movements provided by the regression OPC model may reduce the number of iterations needed by the reference OPC model to create the OPC design layout pattern, thereby reducing computation time.

The regression OPC model approximates OPC using regression; therefore, the regression OPC model is typically simpler than the reference OPC model. In one embodiment of the present invention, the regression OPC model is trained using regression techniques associated with a training design layout pattern. During training, the reference OPC model is used to create training fragment movements of the training design layout pattern. The training fragment movements are associated with OPC of the training design layout pattern. The regression OPC model is trained by using regression to relate the training design layout pattern to the training fragment movements. The regression may be linear regression, which may use Gaussian convolution.

In another embodiment of the present invention, the regression OPC model may be selected from multiple trained regression OPC models. Each of the multiple trained regression OPC models may be evaluated, such that the selected regression OPC model provides estimated evaluation fragment movements that most closely match evaluation fragment movements. During the evaluation, the reference OPC model is used to create the evaluation fragment movements of an evaluation design layout pattern. The evaluation fragment movements are associated with OPC of the evaluation design layout pattern. Each of the multiple trained regression OPC models is used to create a set of estimated evaluation fragment movements of the evaluation design layout pattern. Each set of estimated evaluation fragment movements is compared to the evaluation fragment movements. The regression OPC model that provides the set of estimated evaluation fragment movements that most closely matches the evaluation fragment movements is selected as the regression OPC model.

The comparison of the estimated evaluation fragment movements to the evaluation fragment movements may be based on a root mean square prediction error (RMSPE).

Figure 1A:
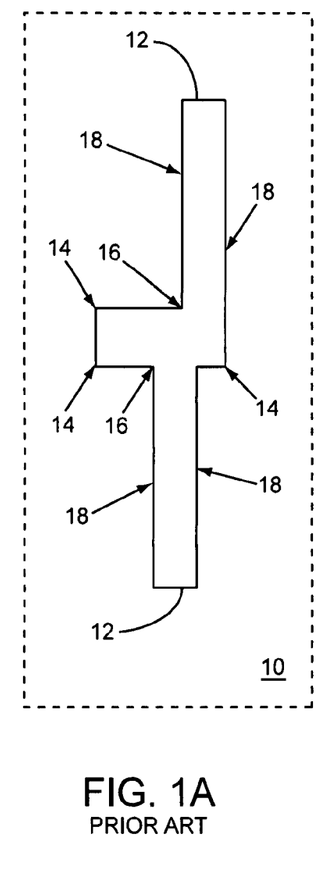
FIG. 1A shows a desired integrated circuit (IC) design layout element according to the prior art.
Figure 1B:
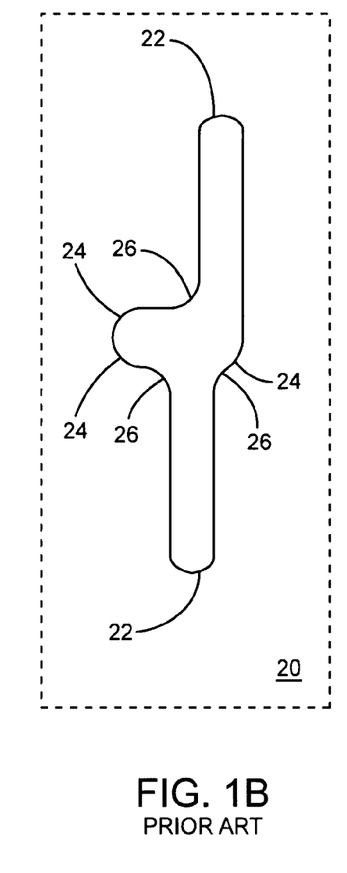
FIG. 1B shows a distorted IC design layout element based on simulating fabrication of the desired IC design layout element illustrated in FIG. 1 using the reference OPC model according to the prior art.
Figure 1C:
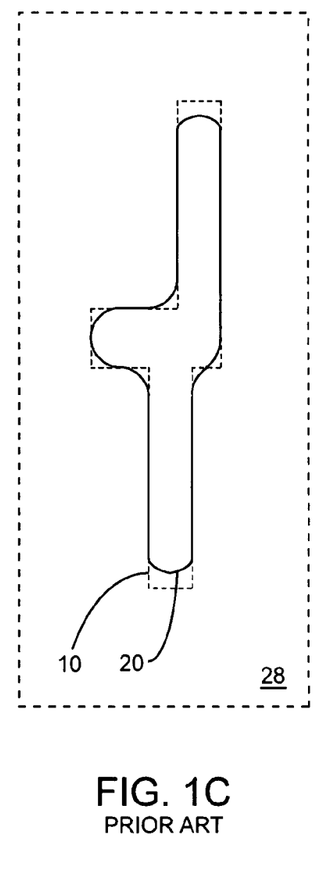
FIG. 1C shows a first composite layout element, which is the distorted IC design layout element superimposed over the desired IC design layout element according to the prior art.

FIG. 1A shows a desired IC design layout element 10 according to the prior art. The desired IC design layout element 10 has several layout features including line ends 12, convex corners 14, concave corners 16, and normal edges 18. FIG. 1B shows a distorted IC design layout element 20 based on simulating fabrication of the desired IC design layout element 10 illustrated in FIG. 1 using the reference OPC model, according to the prior art. The distorted IC design layout element 20 is representative of how the desired IC design layout element 10 would be distorted by the lithography process, the manufacturing process, or both, as determined by the reference OPC model. The distorted IC design layout element 20 has several layout features including shortened line ends 22, rounded convex corners 24, and rounded concave corners 26, which correspond to distortions of the line ends 12, the convex corners 14, and the concave corners 16, respectively, as illustrated in FIG. 1A. FIG. 1C shows a first composite layout element 28, which is the distorted IC design layout element 20 superimposed over the desired IC design layout element 10, according to the prior art. The first composite layout element 28 illustrates the differences between the desired IC design layout element 10 and the distorted IC design layout element 20.

Figure 2A:
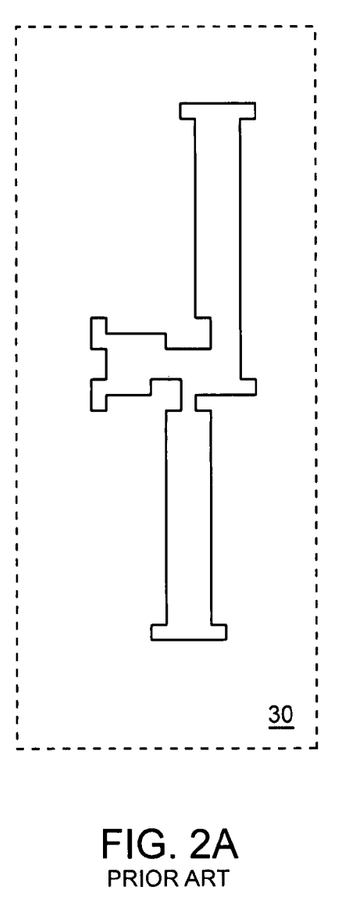
FIG. 2A shows an optical proximity correction (OPC) IC design layout element based on applying OPC to the desired IC design layout element illustrated in FIG. 1A using the reference OPC model according to the prior art.

FIG. 2A shows an OPC IC design layout element 30 based on applying OPC to the desired IC design layout element 10 illustrated in FIG. 1A using the reference OPC model according to the prior art. The OPC IC design layout element 30 represents a pre-distortion of the desired IC design layout element 10 (FIG. 1A), such that when the OPC IC design layout element 30 is used during IC fabrication, the fabrication process, which may include the lithography process, the manufacturing process, or both, distorts the OPC IC design layout element 30 into a shape that is ideally similar to the desired IC design layout element 10 (FIG. 1A).

Figure 2B:
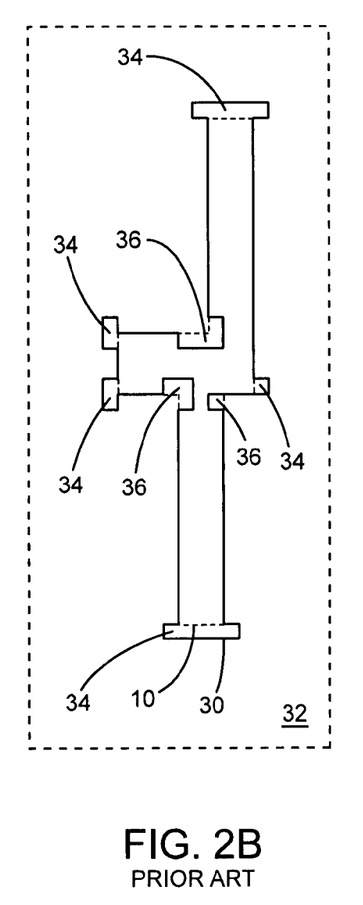
FIG. 2B shows a second composite layout element, which is the OPC IC design layout element superimposed over the desired IC design layout element according to the prior art.

FIG. 2B shows a second composite layout element 32, which is the OPC IC design layout element 30 superimposed over the desired IC design layout element 10 (FIG. 1) according to the prior art. The second composite layout element 32 is indicative of the pre-distortions applied to the desired IC design layout element 10 (FIG. 1) to create the OPC IC design layout element 30. The pre-distortions may include fragment movements. Additive fragment movements 34 add material to a layout to compensate for fabrication distortions that tend to remove material, such as the shortened line ends 22 (FIG. 1B) or the rounded convex corners 24 (FIG. 1B). Subtractive fragment movements 36 remove material from a layout to compensate for fabrication distortions that tend to add material, such as the rounded concave corners 26 (FIG. 1B).

Figure 2C:
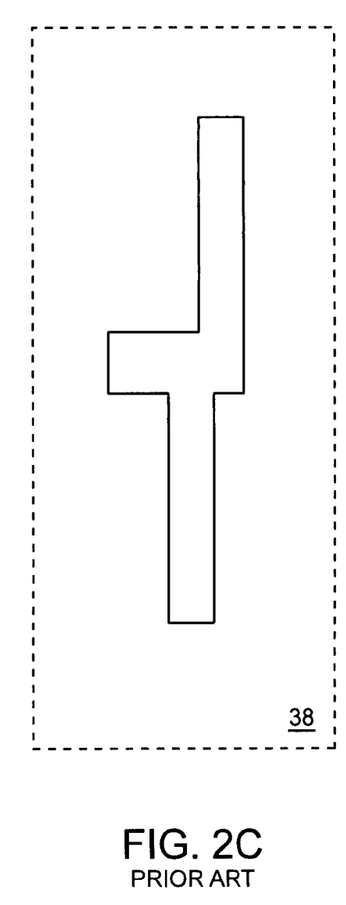
FIG. 2C shows a distorted OPC IC design layout element based on simulating fabrication of the OPC IC design layout element illustrated in FIG. 2A using the reference OPC model according to the prior art.

FIG. 2C shows a distorted OPC IC design layout element 38 based on simulating fabrication of the OPC IC design layout element 30 illustrated in FIG. 2A using the reference OPC model according to the prior art. Ideally, the shape of the distorted OPC IC design layout element 38 is very similar to the shape of the desired IC design layout element 10 (FIG. 1).

Figure 3:
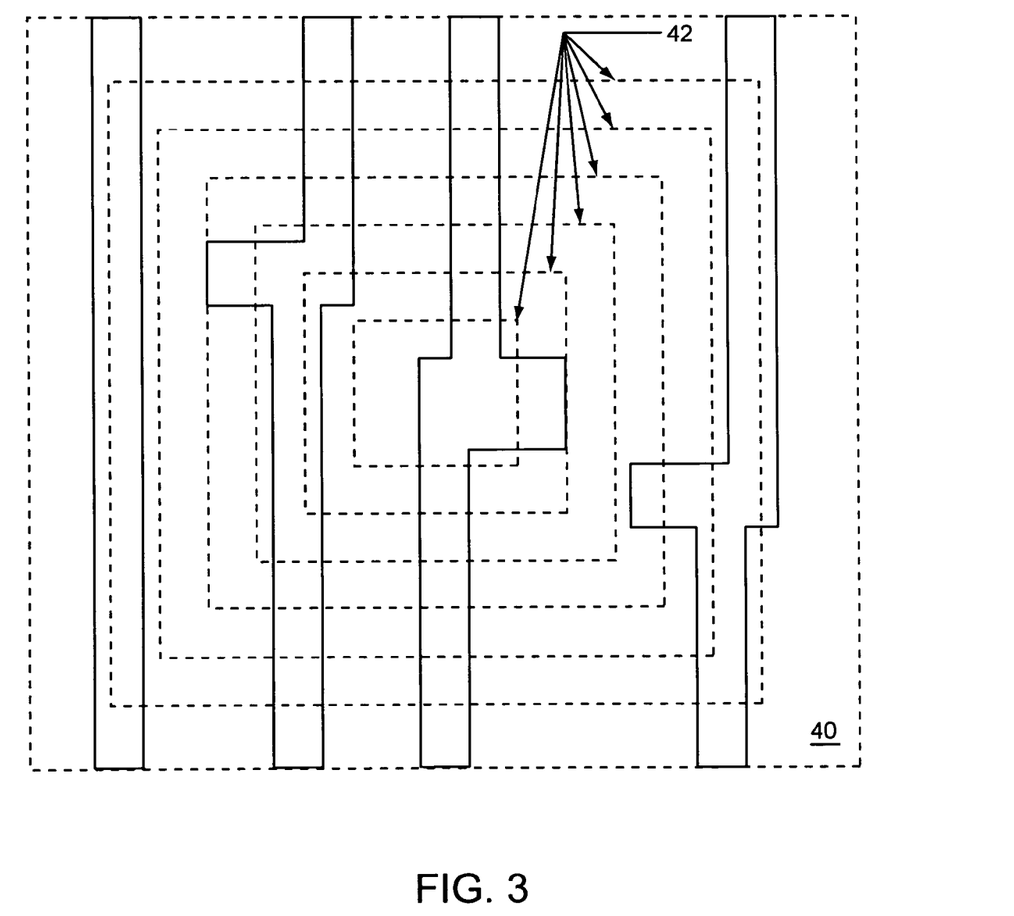
FIG. 3 shows a training design layout pattern according to one embodiment of the present invention.
Figure 4:
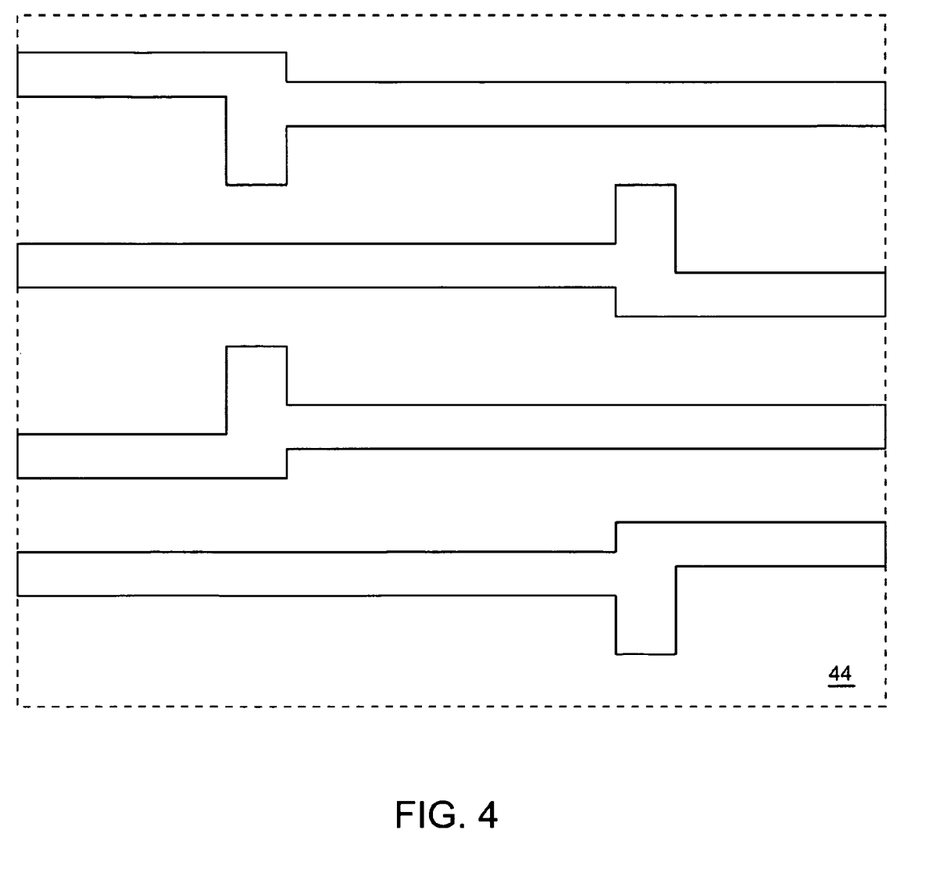
FIG. 4 shows an evaluation design layout pattern according to one embodiment of the present invention.

FIG. 3 shows a training design layout pattern 40 according to one embodiment of the present invention. The training design layout pattern 40 includes concentric rectangular sampling outlines 42. Additionally, the training design layout pattern 40 may include at least one line end 12 (FIG. 1A), at least one convex corner 14 (FIG. 1A), at least one concave corner 16 (FIG. 1A), at least one normal edge 18 (FIG. 1A), or any combination thereof. Alternate embodiments of the training design layout pattern 40 may omit the concentric rectangular sampling outlines 42 or may use sampling outlines of any number, of any shape, or both. The training design layout pattern 40 illustrated in FIG. 3 is an exemplary embodiment of the present invention only. Other embodiments of the present invention may use a training design layout pattern 40 having any number of elements of any shape. FIG. 4 shows an evaluation design layout pattern 44 according to one embodiment of the present invention. The evaluation design layout pattern 44 illustrated in FIG. 4 is an exemplary embodiment of the present invention only. Other embodiments of the present invention may use an evaluation design layout pattern 44 having any number of elements of any shape.

Figure 5:
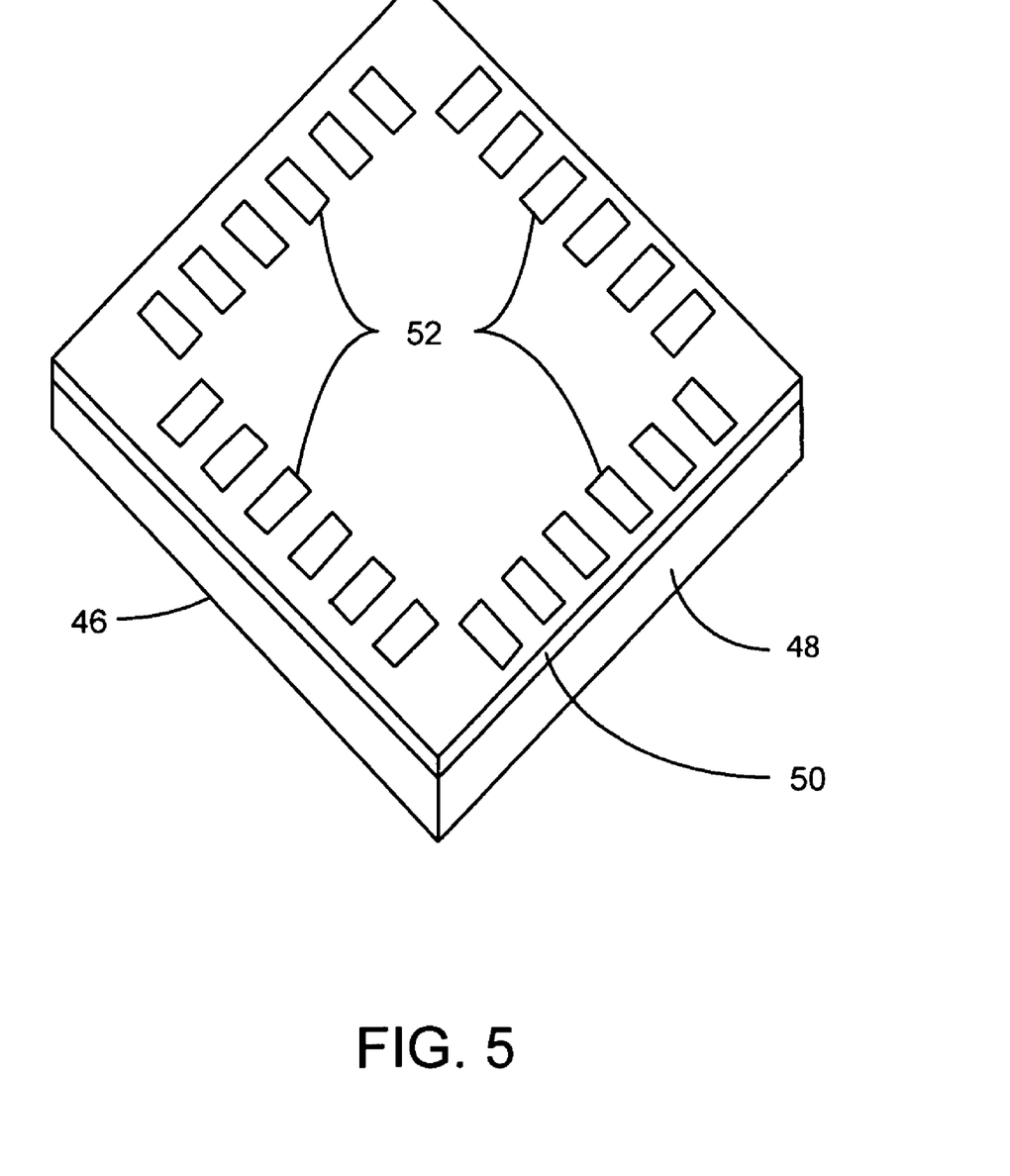
FIG. 5 shows an IC, which has been produced using an OPC design layout pattern provided by the reference OPC model, which used initial fragment movements provided by a regression OPC model according to one embodiment of the present invention.

FIG. 5 shows an IC 46, which has been produced using an OPC design layout pattern provided by the reference OPC model, which used initial fragment movements provided by a regression OPC model according to one embodiment of the present invention. The IC 46 includes a substrate 48, a first fabrication layer 50 over the substrate 48 and inter-connection pads 52 over the first fabrication layer 50. The OPC design layout pattern is used to produce the first fabrication layer 50. Alternate embodiments of the IC 46 may include any number of fabrication layers in addition to the first fabrication layer 50 in any order over the substrate 48.

Figure 6:
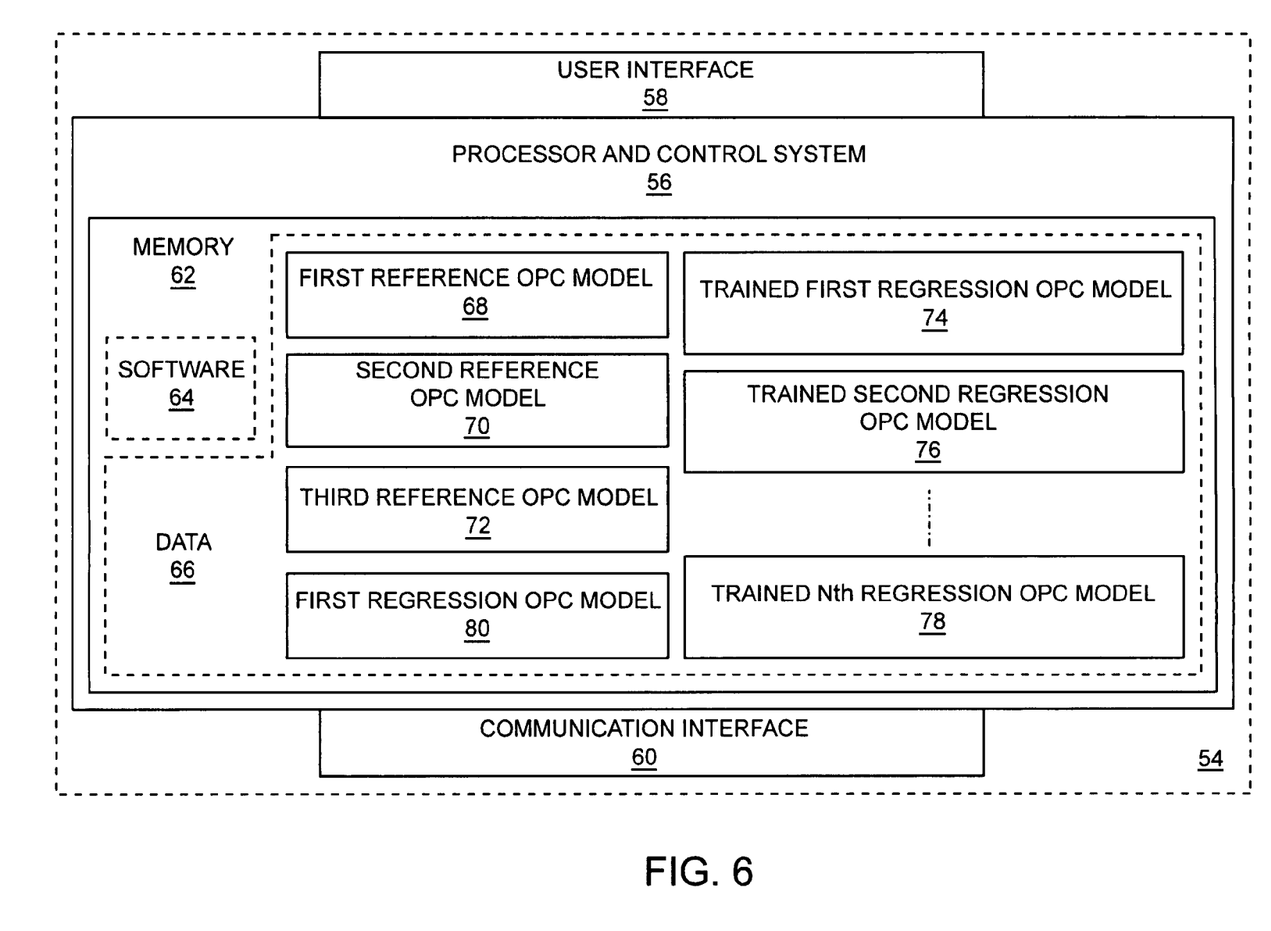
FIG. 6 shows a computing device according to one embodiment of the present invention.

FIG. 6 shows a computing device 54 according to one embodiment of the present invention. The computing device 54 includes a processor and control system 56, a user interface 58, and a communication interface 60. The user interface 58 may be used to accept and transfer user inputs to the processor and control system 56, to provide information to a user from the processor and control system 56, or both. Information external to the computing device 54 may be transferred to the processor and control system 56 through the communications interface 60, from the processor and control system 56 through the communications interface 60, or both. The processor and control system 56 includes memory 62, which stores software 64 and data 66. The memory 62 is one example of a computer readable medium. Other embodiments of the present invention may use other types of computer readable media, such as hard drives, removable memory, fixed memory, flash memory, or the like.

The data 66 includes a first reference OPC model 68, a second reference OPC model 70, a third reference OPC model 72, and multiple trained regression OPC models, which may include a trained first regression OPC model 74, a trained second regression OPC model 76, up to and including a trained Nth regression OPC model 78, and a first regression OPC model 80.

Figure 7:
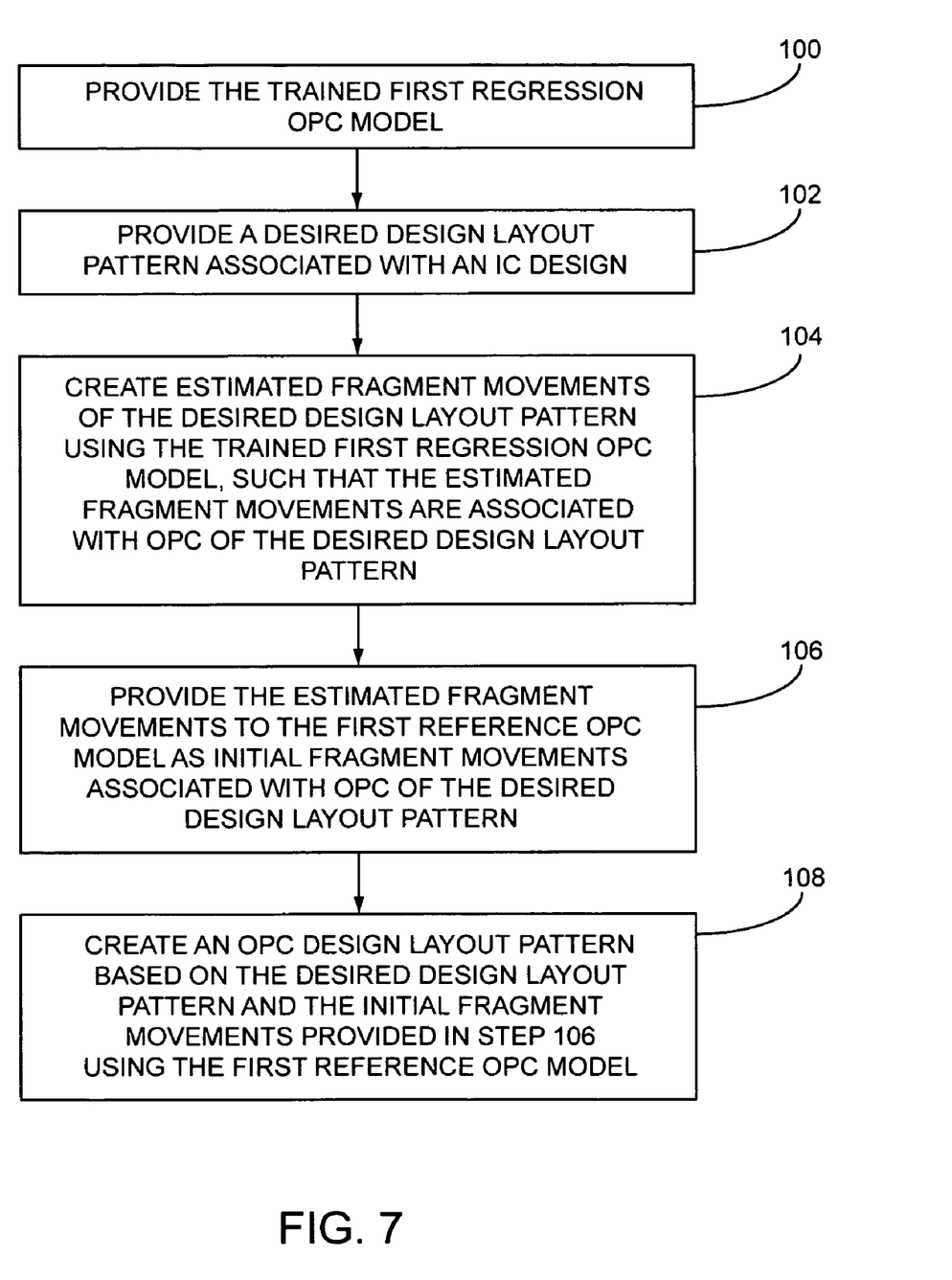
FIG. 7 illustrates a method for creating estimated fragment movements of a desired design layout pattern, and then providing the estimated fragment movements as initial fragment movements to the reference OPC model according to one embodiment of the present invention.

FIG. 7 illustrates a method for creating estimated fragment movements of a desired design layout pattern, and then providing the estimated fragment movements as initial fragment movements to the first reference OPC model 68 according to one embodiment of the present invention. The software 64 includes instructions for instructing the processor and control system 56 to implement the method for creating estimated fragment movements of the desired design layout pattern. The trained first regression OPC model 74 is provided (Step 100). The desired design layout pattern associated with an IC design is provided (Step 102). The processor and control system 56 may receive input data that is representative of the desired design layout pattern. Estimated fragment movements of the desired design layout pattern are created using the trained first regression OPC model 74, such that the estimated fragment movements are associated with OPC of the desired design layout pattern (Step 104). The estimated fragment movements are provided to the first reference OPC model 68 as initial fragment movements associated with OPC of the desired design layout pattern (Step 106). The processor and control system 56 may output data that is representative of the estimated fragment movements. An OPC design layout pattern is created based on the desired design layout pattern using the first reference OPC model 68 and the initial fragment movements provided in Step 106 (Step 108).

In one embodiment of the method for creating estimated fragment movements illustrated in FIG. 7, Step 108 may be omitted. In an alternate embodiment of the method for creating estimated fragment movements illustrated in FIG. 7, the OPC design layout pattern created in Step 106 is used to produce the first fabrication layer 50 (FIG. 5).

Figure 8:
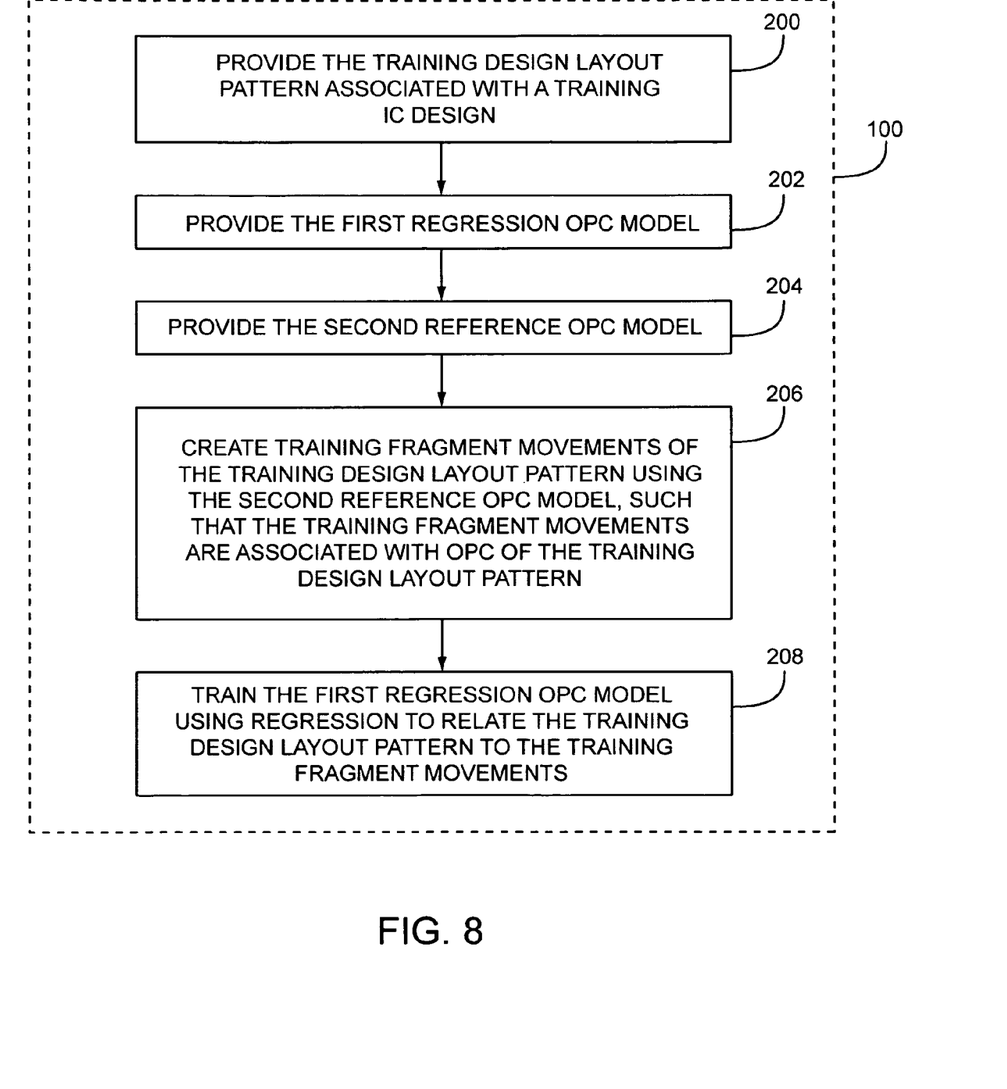
FIG. 8 illustrates a method for training a first regression OPC model, according to one embodiment of the present invention.

FIG. 8 illustrates a method for training the first regression OPC model 80 to provide the trained first regression OPC model 74 (Step 100)(FIG. 7) according to one embodiment of the present invention. The software 64 includes instructions for instructing the processor and control system 56 to implement the method for training the first regression OPC model 80. The training design layout pattern 40 associated with a training IC design is provided (Step 200). The first regression OPC model 80 is provided (Step 202). The second reference OPC model 70 is provided (Step 204). Training fragment movements of the training design layout pattern 40 are created using the second reference OPC model 70, such that the training fragment movements are associated with OPC of the training design layout pattern 40 (Step 206). The first regression OPC model 80 is trained using regression to relate the training design layout pattern 40 to the training fragment movements (Step 208).

In one embodiment of the present invention, the second reference OPC model 70 is the first reference OPC model 68. In an alternate embodiment of the present invention, the regression to relate the training design layout pattern 40 to the training fragment movements (FIG. 8) includes linear regression. In an additional embodiment of the present invention, the concentric rectangular sampling outlines 42 (FIG. 3) are used in concentric rectangular sampling to sample the training design layout pattern 40 to relate the training design layout pattern 40 to the training fragment movements. In another embodiment of the present invention, the concentric rectangular sampling includes concentric square sampling, which may be based on concentric square sampling outlines (not shown).

Figure 9:
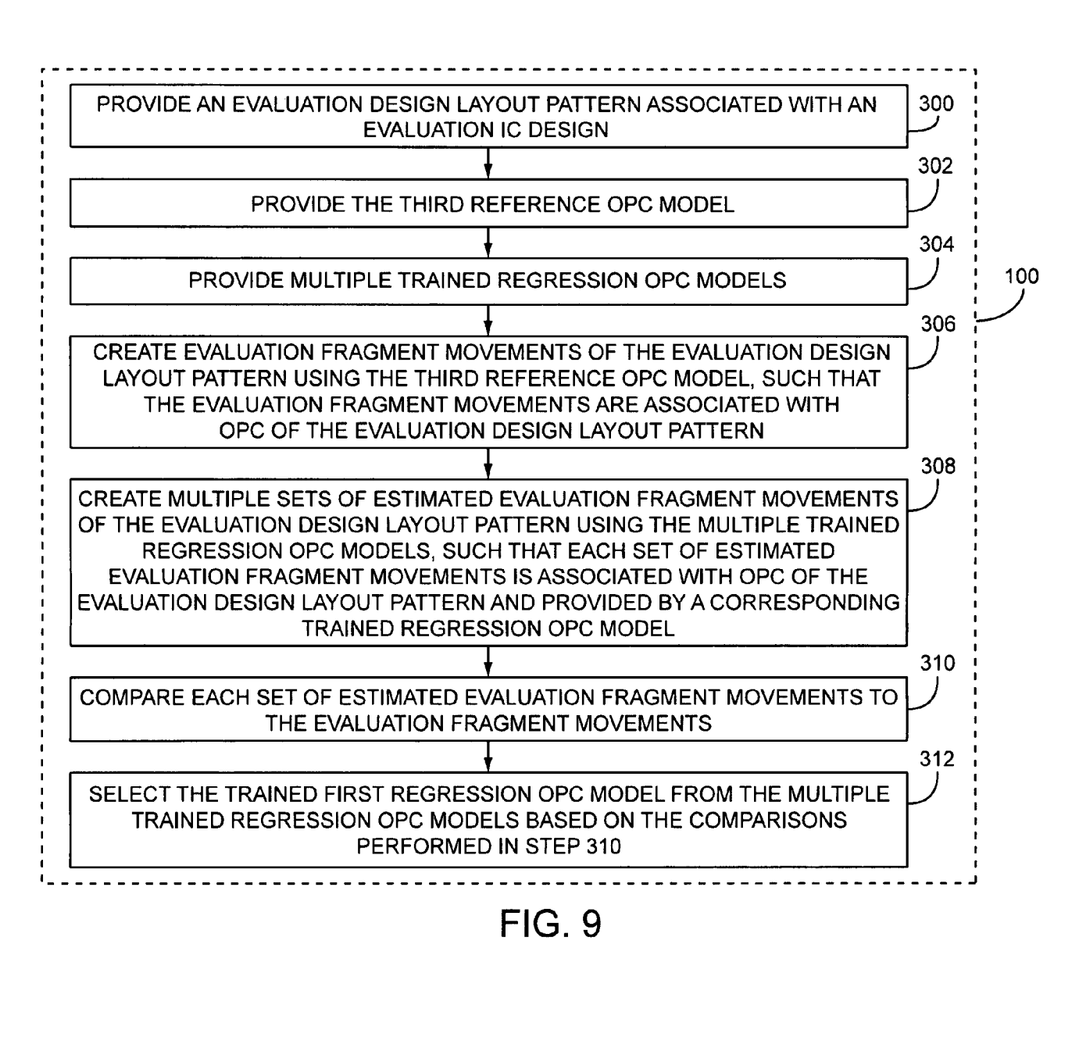
FIG. 9 illustrates a method for evaluating multiple regression OPC models and selecting the trained first regression OPC model according to one embodiment of the present invention.

FIG. 9 illustrates a method for evaluating multiple regression OPC models and selecting the best regression OPC model, which provides the trained first regression OPC model 74 (Step 100)(FIG. 7) according to one embodiment of the present invention. The software 64 includes instructions for instructing the processor and control system 56 to implement the method for evaluating multiple regression OPC models and selecting the best regression OPC model. The evaluation design layout pattern 44 associated with an evaluation IC design is provided (Step 300). The third reference OPC model 72 is provided (Step 302). The multiple trained regression OPC models are provided (Step 304). Evaluation fragment movements of the evaluation design layout pattern 44 are created using the third reference OPC model 72, such that the evaluation fragment movements are associated with OPC of the evaluation design layout pattern 44 (Step 306). Multiple sets of estimated evaluation fragment movements of the evaluation design layout pattern 44 are created using the multiple trained regression OPC models, such that each set of estimated evaluation fragment movements is associated with OPC of the evaluation design layout pattern 44 and provided by a corresponding trained regression OPC model (Step 308). Each set of estimated evaluation fragment movements is compared to the evaluation fragment movements (Step 310). The trained first regression OPC model 74 is selected from the multiple trained regression OPC models based on the comparisons performed in Step 310 (Step 312). In one embodiment of the present invention, the third reference OPC model 72 is the first reference OPC model 68. In an alternate embodiment of the present invention, the selection of the trained first regression OPC model 74 is based on root mean square prediction error (RMSPE) calculations.

Several exemplary embodiments of the present invention are presented below.

Regression is a statistical technique which models the dependence of an output y, which is based on the training fragment movements, on input features $\vec{x}$, which is based on the training design layout pattern 40. A linear regression model assumes the output y is linearly dependent on the input feature $\vec{x}$ plus some noise. The model can be written as $y = \vec{\beta}^T \vec{x} + \epsilon$, where $\epsilon$ is a zero mean additive noise, which is a zero mean additive Gaussian noise with a variance $\sigma^2$. A parameter vector $\vec{\beta}$; specifies how much each component of the input feature $\vec{x}$ contributes to the output, y. Therefore, in mathematical terms $P(y|\vec{\beta}, \sigma^2, \vec{x}) = N(\vec{\beta}^T \vec{x}, \sigma^2)$ and given the input feature $\vec{x}$, the best estimate of y is $E[y|\vec{x}] = \vec{\beta}^T \vec{x}$.

In order to estimate the output y for the given input feature $\vec{x}$, the parameter vector $\vec{\beta}$ is needed. However, the parameter vector $\vec{\beta}$ is usually unknown and needs to be estimated through a training process. Given N observation pairs, $\{(y_i, \vec{x}_i), i=1, 2, \ldots N\}$, it is possible to estimate value of the parameter vector $\vec{\beta}$ as the one that minimized the $\Sigma(y_i - \vec{\beta}^T \vec{x}_i)^2$, or equivalently as $$\vec{\beta} = \arg\min_{\vec{\beta}} \|X\vec{\beta} - \vec{y}\|^2, \qquad \text{EQ. 1}$$

where each input feature vector $\vec{x}_i$ is a row in the matrix X and each output, $y_i$ is a component in the vectors $\vec{y}$. It can be easily shown that $$\vec{\beta} = (X^T X)^{-1} (X^T \vec{y}), \qquad \text{EQ. 2:}$$

which is the solution to the least square problem in EQ 1. In one embodiment of the present invention, the regression to relate the training design layout pattern 40 to the training fragment movements (FIG. 8) includes linear regression, which uses the formula $y = \vec{\beta}^T \vec{x} + \epsilon$ to relate the training design layout pattern 40 to the training fragment movements.

In this section, we determine the best input feature and its associated dimension. Mentor Graphics Calibre™ is a commercially available software package that may be used to perform model based OPC. In an exemplary embodiment of the present invention, a vector optical model with wavelength λ=193 nm, NA=0.85 for two 90 nm IC designs, an annular aperture with a σ=0.88/0.44, and a VT5 resist model are used. The surrounding 2 μm by 2 μm layout pattern for each fragment is captured and used to derive its movement using this exemplary embodiment. The 2 μm by 2 μm layout pattern surrounding each fragment is chosen since the spatial influence of the optical model has a diameter of 1.28 μm, and the interaction diameter in the resist model is 1.8 μm. The layout pattern is sampled at 5 nm pixel resulting in a 400 pixel by 400 pixel binary bitmap. The 5 nm sampling is chosen because the optical model has a 5 nm optical grid size.

In optical lithography, the maximum spatial frequency is $$\frac{NA}{\lambda},$$

where NA is a numerical aperture of the lens and $\lambda$ is the wavelength of the illumination source. It has been shown that different resolution enhancement techniques can at most increase the maximum spatial frequency to $$\frac{2NA}{\lambda}.$$

As such, patterns with sharp corners are not physically feasible; therefore, low pass filter layout patterns are used as features in the linear regression model to predict the fragment movements. Specifically, a 2 μm by 2 μm layout pattern is filtered with a Gaussian low pass filter with cut off frequency or $$\frac{2NA}{\lambda}.$$

The optimal fragment movement depends on the 2 μm by 2 μm pattern. However, it is impractical to use all the layout pixels as the input feature vector; specifically, the 400 pixel by 400 pixel pattern translates into a feature vector in $\mathfrak{R}^{160000}$. For this high dimensional vector, it is very difficult to collect enough sample patterns and the corresponding fragment movements in order to ensure that the resulting matrix $X^T X$ is inevitable. In addition, evaluating the value of $\vec{\beta}$ in the linear regression model is quite computation intensive. However, because of the low pass operation, the pattern mainly consists of low frequency components, and as such, only few frequency domain coefficients, such as Discrete Cosine Transform (DCT) coefficients, are required to approximate it. Furthermore, since optical and process proximity effects decrease with distance, the 400 pixel by 400 pixel patterns can be sub-sampled more densely near a fragment of interest.

Experimental results are presented that illustrate optimal input features such as space domain pixels or frequency domain DCT coefficients, as well as a number of components for each type of feature. Additionally, the issue of whether multiple regression models are needed for multiple types of fragments such as normal edge, convex, and concave, is discussed. Prediction results on new data sets using optimum input features is presented.

In one exemplary embodiment of the present invention, root mean square prediction error (RMSPE) is used as a metric to compare the performance of the various approaches. The RMSPE is defined as $$RMSPE = \sqrt{\frac{1}{N}\sum (y_i - \hat{y}_i)^2}, \quad (3)$$

where $y_i$ is the fragment movement determined by the second reference OPC model 70, and $\vec{y}$ is the estimated fragment movement obtained using the regression OPC model. The smaller the RMSPE value, the more effective the linear regression model is at predicting the fragment movement. If the RMSPE is 0, then every estimated fragment movement is exactly equal to the fragment movement obtained via the third reference OPC model 72. The RMSPE may be calculated on new test data sets that are not used during the training process to estimate the parameter vector $\vec{\beta}$.

In an exemplary embodiment of the present invention, model based OPC is performed on a 100 μm×100 μm section of logic layout from design A, and 4871 pairs of fragment movements are selected and associated patterns among all the available pairs in the 100 μm×100 μm section of the layout. These pairs are selected in such a way as to cover all possible values of model based OPC fragment movements in the 100 μm×100 μm patch. For example, if model based OPC results in fragment movement of 36 nm for any fragments in the 100 μm×100 μm patch, then at least one of the 4871 pairs correspond to a model based OPC fragment movement of 36 nm. About half of the 4871 pairs, or 2436 pairs are used for training, and the remaining half are used for testing. The 4871 pairs are divided into training and evaluation set in such a way that both sets contain approximately equal number of the same fragment movements. However, if a particular value of fragment movement is associated with only one pattern, then it is placed in the training set to ensure the training set covers the entire range of fragment movements. The 2436 training pairs consist of 625 pairs with the normal edge 18 (FIG. 1A), 847 pairs with the concave corner 16 (FIG. 1A), and 964 pairs with the convex corner 14 (FIG. 1A) fragments.

The linear regression model is trained with DCT coefficients from the filtered 2 μm by 2 μm layout patterns. The first 200, 300, 400, and 500 DCT coefficients are used as the input features, and the coefficients are encoded into a feature vector using zig-zag ordering from lowest to highest frequency.

The regression model is trained with sampled pixel values of the filtered layout pattern. Pixel values are sampled at the four corners and the midpoint of each side of the squares that overlay the pattern. The radius of the concentric squares are 0, 4, 8, 12, . . . , $R_{int}$, $R_{int}+8$, $R_{int}+16$, . . . , 200 pixels, respectively, where $R_{int}$ controls the sampling density. The regression model is trained with $R_{int}=\{60, 80, 100, 120, 140\}$ resulting in 257, 281, 297, 321, and 337 pixel values, respectively. Similar to DCT coefficients, in addition to the pixel values, each input feature vector also contains three binary variables indicating the type of fragments whose movement is being predicated.

As described earlier, 2435 of the 4281 pairs are used from design A for evaluation. The testing set contains 625 pairs with normal edge, 846 pairs with concave corner, and 964 pairs with convex corner fragments. The linear regression model is trained with a variety of number of DCT coefficients as described earlier. For each pattern, the fragment movement is predicted as $\vec{y}=\vec{\beta}^T\vec{x}$, where $\vec{x}$ is a feature vector containing 3 indicator variables and the DCT coefficients. The 200 DCT coefficients result in the highest, and 500 DCT coefficients result in the lowest RMSPE at 8.84 nm and 5.20 nm, respectively.

The linear regression model is also trained with input feature vectors containing sub-sampled pixel values on concentric squares. The model is applied on the 2435 test data points, and the largest RMSPE is 3.51 nm when $R_{inner}=60$ and the smallest RMSPE is 3.44 nm when $R_{inner}=120$. The largest RMSPE using the pixel values as input features is 34% smaller than the smallest RMSPE using the DCT coefficients as input features. This means that the pixel values are likely to outperform the DCT coefficients as input features. As mentioned earlier, OPC increases the spatial frequency of the resulting patterns on the wafer, and therefore, it is possible that both the low and the high frequency DCT coefficients are needed to effectively predict the fragment movements.

Different types of fragments may possess different movement characteristics as obtained via model based OPC. This raises the question as to whether training separate models for each fragment type is likely to improve the performance. Sub-sampled pixel values have been shown to outperform DCT coefficients; therefore, separate models may be created for each fragment type. In doing so, the indicator variables indicating the fragment type are removed from the input feature vector. Using separate regression models for each type of fragment results in significantly lower RMSPE than a single model for all values of $R_{inner}$. The best feature vector may corresponds to having a separate model for each fragment type consisting of sub-sampled pixel values with $R_{inner}=80$.

In an exemplary embodiment of the present invention, sub-sampled pixel values with $R_{inner}=80$ are used as the input feature vector to train a different model for the normal edge 18, the concave corner 16, and the convex corner 14 fragments using a 60 µm by 50 µm portion of design A. Even though the optimum model may correspond to sub-sampled pixel values with $R_{inner}=80$, its training set does not necessarily cover the entire range of fragment movements for ever training type. To this end, a subset of all the pairs of layout patterns and their corresponding fragment movements obtained via model based OPC in a 60 µm by 50 µm patch of layout A is collected for training purposes. Specifically, 2675 pairs of pattern and movement with normal edge, 2784 pairs with concave corner, and 2680 pairs with convex corner fragments are collected in such a way to ensure the training data covers the range of fragment movements for each type of fragment. The resulting parameter vector, $\vec{\beta}$, is used to test on another section of logic layout from design A, as well as a section of logic layout from design B.

In an exemplary embodiment of the present invention, a regression OPC model is tested on a different 70 µm by 50 µm section of logic layout from design A, which has 27432 with normal edge, 2796 with concave corner, and 8203 with convex corner fragments. The smallest RMSPE is 2.125 nm for convex corner fragments, and the largest RMSPE is 2.876 nm for concave corner fragments. Furthermore, more than 93% of the predicted fragment movements are in the same direction as the third reference OPC model 72 fragment movements.

In an exemplary embodiment of the present invention, the linear regression model is tested on a 18 µm by 16 µm section of logic layout from a different IC design B, with 4055 with normal edge, 455 with concave corner, and 995 with convex corner fragments. Over 90% of the predicted fragment movements are in the same direction as the fragment movements generated by the third reference OPC model 72. Furthermore, the largest RMSPE is 3.94 nm for the concave corner fragments.

The RMSPE for design B is higher than design A, and the percentage of predicted movements in the right direction is lower for design B than for design A. Also, the percentage of absolute prediction errors below 2 nm for design B is lower than that of design A. Therefore, the prediction on test data set from design A may outperform design B since the training data also comes from a portion of design A.

The issue of whether the number of iterations can be reduced by using the estimated fragment movements as initial fragment movements is examined. The predictions are applied before model based OPC by creating tags on fragments for each value of predicted movement in Mentor Graphics Calibre™, and using the command "opcTag hintoffset".

Even though the ordinary linear regression model works well with logic sections of layouts, it performs poorly on memory, as well as control memory and logic layouts. This can be attributed to the redundancy of training patterns resulting from repetitions in memory portions of layouts. This redundancy causes the matrix $X^TX$ in EQ. 2 to become singular or ill-conditioned so that its inverse cannot be accurately computed. In an exemplary embodiment of the present invention, a modified version of linear regression, called principal component regression (PCR), is used to address this problem.

PCR is a statistical technique that reduces the dimensionality of the input feature vector using principal component analysis before modeling the dependence of the output y on the input $\vec{x}$. The idea is to eliminate redundant components of the input feature vector before applying regression. To accomplish this, the covariance matrix $X^TX=V\Lambda V^T$ is diagonalized, where columns of V are principal components, and $\Lambda$ is a diagonal matrix corresponding to variances of the principle components. It is assumed the principal components with higher variances to have a larger influence on the prediction of the model. After ranking the principal components by their variances, the top n % are used as column vectors to form a transformation matrix T. It has been empirically determined the optimal value of n in the present application to be around 80. Thus, the new regression model becomes $y=\vec{\beta}^T(\vec{x}T)+\epsilon$.

In an exemplary embodiment of the present invention, model based OPC is performed on a 5 µm×4 µm section of memory layout from design A, 1346 pairs of fragment movements, and associated patterns are used to train ordinary and principal component regression models, respectively. Models are evaluated on another 15 µm×14 µm section of memory layout from design A. In comparison with ordinary linear regression, a larger percentage of the fragment movement predictions resulting from PCR are in agreement with those computed using the third reference OPC model 72. This is more pronounced for normal and convex fragments than concave ones where the percentages are quite close. Ordinary linear regression completely fails on predicting edge movements for this particular section of memory layout with RMSPE skyrocketing for normal and convex fragments. On the other hand, the RMSPEs of PCR are comparable with those for the logic layout. In summary, both metrics indicate that PCR does an almost perfect job in predicting edge movements for normal fragments.

In an exemplary embodiment of the present invention, incremental concentric square sampling (ICSS) may be used. Basic concentric square sampling (CSS) may outperform DCT coefficients as features. In one example, CSS divides the sampling area into two regions with the inner region sampled at a higher density. Even though this method takes into account proximity effects of layout portions that are closer to the fragment, it is overly simplistic.

Since OPC is essentially an optical correction process, the effects of a mask pattern on the wafer obey the inverse square law, which states that the intensity of light from a source is inversely proportional to the square of the distance from the source. This implies that the effect of mask patterns on the fragment being moved during OPC is inversely proportional to the square of the distance between the mask pattern and the fragment.

As such, ICSS may be used to create the feature vectors. Pixel values are sampled at the four corners and the mid point of each side of the squares that overlay the layout pattern. However, in contrast with CSS, the radius of the $n^{th}$ square in pixels is defined recursively as $R_n = R_{n+1} + n$, with $R_0 = 0$, in accordance with the inverse square law. This reduces samples size from 281 to 161, saving 42% of computation time. The first few radii of the squares are 0, 1, 3, 6, 10 pixels.

To compare the performance of ICSS with CSS, both sampling techniques are used to train a PCR model for a 30 μm×30 μm section of logic layout from design A. The resulting model is evaluated on a 14 μm×15 μm section of memory layout from design A, a 50 μm×45 μm section of logic layout from design B, and a 45 μm×45 μm section of layout consisting of both logic and memory circuits from design A. $R_{inner}$ for CSS is chosen to be 80. With 42% fewer components in the feature vectors, ICSS actually outperforms CSS on both the direction and accuracy of its predictions for all three layouts. ICSS may not only achieve higher prediction accuracy, but may also save computation time.

In an exemplary embodiment of the present invention, the performance of PCR with ICSS is characterized by providing its predictions as initial conditions to the iterations of model based OPC software in order to determine the extent to which the number of iterations can be reduced for the three sections of the above layouts. The combination of PCR and ICSS may save between six to eight iterations of model based OPC for all three classes of layout from designs A and B. In comparison, PCR with ICSS overperforms linear regression with CSS on memory as well as control memory and logic layouts, and underperforms on logic layout. But because PCR with ICSS uses feature vectors with only half the number of dimensions, and works in situations of redundant training data, it may be considered a superior method.

Those skilled in the art will recognize improvements and modifications to the preferred embodiments of the present invention. All such improvements and modifications are considered within the scope of the concepts disclosed herein and the claims that follow.

What is claimed is:

1. A method comprising:
   providing a trained first regression optical proximity correction (OPC) model;
   providing a desired design layout pattern associated with an integrated circuit (IC) design;
   creating estimated fragment movements of the desired design layout pattern using the trained first regression OPC model, such that the estimated fragment movements are associated with OPC of the desired design layout pattern; and
   providing the estimated fragment movements to a first reference OPC model as initial fragment movements associated with OPC of the desired design layout pattern.

2. The method of claim 1 further comprising creating an OPC design layout pattern based on the desired design layout pattern and the initial fragment movements using the first reference OPC model.

3. The method of claim 1 wherein a first regression OPC model is trained to provide the trained first regression OPC model by:
   providing a training design layout pattern associated with a training IC design;
   providing a second reference OPC model;
   creating training fragment movements of the training design layout pattern using the second reference OPC model, such that the training fragment movements are associated with OPC of the training design layout pattern; and
   training the first regression OPC model using regression to relate the training design layout pattern to the training fragment movements.

4. The method of claim 3 wherein the second reference OPC model is the first reference OPC model.

5. The method of claim 3 wherein the regression comprises linear regression.

6. The method of claim 5 wherein the linear regression uses a first formula to relate the training design layout pattern to the training fragment movements, such that:
   the first formula is $$y = \vec{\beta}^T \vec{x} + \epsilon;$$

$\epsilon$ is a zero mean additive noise;
   $\vec{x}$ is an input feature, which is based on the training design layout pattern;
   y is an output, which is based on the training fragment movements; and
   $\vec{\beta}$ is a parameter vector, which specifies how much each component of the input feature contributes to the output.

7. The method of claim 6 wherein a second formula is used to determine the parameter vector, such that
   the second formula is $$\vec{\beta} = \arg\min_{\vec{\beta}} \left\| X\vec{\beta} - \vec{y} \right\|^2;$$

X is a matrix;
   a plurality of input features is based on the training design layout pattern, such that rows of the matrix are based on the plurality of input features; and
   $\vec{y}$ is an output vector, which is based on a plurality of outputs that are based on the training fragment movements, such that each of the plurality of outputs has a corresponding one of the plurality of input features.

8. The method of claim 3 wherein the training design layout pattern comprises at least one convex corner, at least one concave corner, and at least one normal edge.

9. The method of claim 3 wherein the using regression to relate the training design layout pattern to the training fragment movements uses samples of the training design layout pattern based on concentric rectangular sampling to relate the training design layout pattern to the training fragment movements.

10. The method of claim 9 wherein the concentric rectangular sampling is concentric square sampling.

11. The method of claim 1 wherein the trained first regression OPC model is selected from a plurality of trained regression OPC models by:
   providing an evaluation design layout pattern associated with an evaluation IC design;
   providing the plurality of trained regression OPC models;
   providing a second reference OPC model;
   creating evaluation fragment movements of the evaluation design layout pattern using the second reference OPC model, such that the evaluation fragment movements are associated with OPC of the evaluation design layout pattern;

creating a plurality of sets of estimated evaluation fragment movements of the evaluation design layout pattern using the plurality of trained regression OPC models, such that each of the plurality of sets of estimated evaluation fragment movements is associated with OPC of the evaluation design layout pattern and provided by a corresponding each of the plurality of trained regression OPC models;

comparing each of the plurality of sets of estimated evaluation fragment movements to the evaluation fragment movements; and selecting the trained first regression OPC model from the plurality of trained regression OPC models based on the comparison of the each of the plurality of sets of estimated evaluation fragment movements to the evaluation fragment movements.

12. The method of claim 11 wherein the selection of the trained first regression OPC model from the plurality of trained regression OPC models is further based on root mean square prediction error (RMSPE) calculations.

13. The method of claim 11 wherein the second reference OPC model is the first reference OPC model.

14. A non-transitory computer readable medium storing software comprising instructions for instructing a processor to:

receive input data that is representative of a desired design layout pattern associated with an integrated circuit (IC) design;

create estimated fragment movements of the desired design layout pattern using a trained first regression optical proximity correction (OPC) model, such that the estimated fragment movements are associated with OPC of the desired design layout pattern; and provide output data that is representative of the estimated fragment movements, such that the estimated fragment movements are used by a first reference OPC model as initial fragment movements associated with OPC of the desired design layout pattern.

15. A method comprising:

providing a substrate; and providing a first fabrication layer over the substrate, such that the first fabrication layer is formed using an optical proximity correction (OPC) design layout pattern, which is provided by:

providing a trained first regression OPC model;

providing a desired design layout pattern associated with a design of an integrated circuit (IC);

creating estimated fragment movements of the desired design layout pattern using the trained first regression OPC model, such that the estimated fragment movements are associated with OPC of the desired design layout pattern;

providing the estimated fragment movements to a first reference OPC model as initial fragment movements associated with OPC of the desired design layout pattern; and creating the OPC design layout pattern based on the desired design layout pattern and the initial fragment movements using the first reference OPC model.

* * * * *